United States Patent
Krishnamoorthy

(10) Patent No.: US 11,935,979 B2
(45) Date of Patent: Mar. 19, 2024

(54) LIGHTWEIGHT SOLAR PANELS WITH SOLAR CELL STRUCTURAL PROTECTION

(71) Applicant: HELION CONCEPTS, INC., Saratoga, CA (US)

(72) Inventor: Sudarshan Krishnamoorthy, Saratoga, CA (US)

(73) Assignee: HELION CONCEPTS, INC., Saratoga, CA (US)

( * ) Notice: Subject to any disclaimer, the term of this patent is extended or adjusted under 35 U.S.C. 154(b) by 408 days.

(21) Appl. No.: 17/133,038

(22) Filed: Dec. 23, 2020

(65) Prior Publication Data

US 2021/0126144 A1    Apr. 29, 2021

Related U.S. Application Data

(63) Continuation of application No. 15/959,953, filed on Apr. 23, 2018, now abandoned.

(Continued)

(51) Int. Cl.
*H01L 31/048* (2014.01)
*H01L 31/02* (2006.01)
(Continued)

(52) U.S. Cl.
CPC ...... *H01L 31/049* (2014.12); *H01L 31/02008* (2013.01); *H01L 31/0481* (2013.01); *H02S 30/10* (2014.12); *Y02E 10/50* (2013.01)

(58) Field of Classification Search
CPC ... H01L 31/048; H01L 31/049; H01L 31/042; H01L 31/04; H02S 30/10; H02S 30/20; H02S 20/22–25
See application file for complete search history.

(56) References Cited

U.S. PATENT DOCUMENTS

| 3,603,915 A | 9/1971 | Jayne et al. |
| 4,235,643 A | 11/1980 | Amick |

(Continued)

FOREIGN PATENT DOCUMENTS

| JP | 2670472 B2 * | 7/1997 | .......... H01L 31/042 |
| JP | 2001068184 A | 3/2001 | |

(Continued)

OTHER PUBLICATIONS

English machine translation for Mori (JP 2670472) published Jul. 4, 1997.*

(Continued)

*Primary Examiner* — Christina Chern
(74) *Attorney, Agent, or Firm* — Seager, Tufte & Wickhem LLP

(57) ABSTRACT

Light-weight, flexible solar panels adapted to prevent inadvertent stress on silicon solar photovoltaic cells inside solar panels. In some examples, a solar panel comprising solar cells includes a plurality of supports, such as one support for each solar cell, with gaps between the supports to allow the panel to flex when strained while protecting the individual cells. In other examples, a solar panel comprises a plurality of solar cells and a support or plural supports designed to accept force applied to the top of the panel and divert such force around the individual cells, without the use of a heavy glass support over top. Some examples may include both individual supports for each cell, with each individual support further adapted to direct applied forces around the individual cells.

12 Claims, 14 Drawing Sheets

Related U.S. Application Data

(60) Provisional application No. 62/489,232, filed on Apr. 24, 2017.

(51) Int. Cl.
*H01L 31/049* (2014.01)
*H02S 30/10* (2014.01)

(56) References Cited

U.S. PATENT DOCUMENTS

| | | | |
|---|---|---|---|
| 4,582,953 | A | 4/1986 | Nagase et al. |
| 4,931,021 | A | 6/1990 | Mohan |
| 4,979,903 | A | 12/1990 | Gosselin |
| 5,108,295 | A | 4/1992 | Koike et al. |
| 5,411,402 | A | 5/1995 | Bethurum |
| 6,030,231 | A | 2/2000 | Sarkiniemi |
| 6,062,911 | A | 5/2000 | Davis et al. |
| 6,102,734 | A | 8/2000 | Kuo |
| 7,285,719 | B2 | 10/2007 | Conger |
| 7,320,606 | B2 | 1/2008 | Midorikawa |
| 7,390,961 | B2 | 6/2008 | Aschenbrenner et al. |
| 7,710,740 | B2 | 5/2010 | Liu |
| 7,802,994 | B1 | 9/2010 | Chen et al. |
| 7,804,022 | B2 | 9/2010 | De Ceuster |
| 8,016,007 | B2 | 9/2011 | Ashjaee et al. |
| 8,148,627 | B2 | 4/2012 | Rose et al. |
| 8,272,897 | B1 | 9/2012 | Lin |
| 8,282,403 | B2 | 10/2012 | Sawai |
| 8,475,184 | B2 | 7/2013 | Hasegawa |
| 8,684,752 | B2 | 4/2014 | Hsueh |
| 8,727,813 | B2 | 5/2014 | Yang et al. |
| 8,740,642 | B2 | 6/2014 | Keenihan et al. |
| 8,821,178 | B2 | 9/2014 | Fukui et al. |
| 8,998,660 | B2 | 4/2015 | Bakos |
| 9,095,069 | B2 | 7/2015 | Stefanoff et al. |
| 9,136,655 | B2 | 9/2015 | Moon et al. |
| 9,166,327 | B2 | 10/2015 | Yu |
| 2002/0080590 | A1 | 6/2002 | Bauermeister |
| 2002/0094708 | A1 | 7/2002 | Budman et al. |
| 2006/0067064 | A1 | 3/2006 | Crews et al. |
| 2008/0144301 | A1 | 6/2008 | Konishi |
| 2008/0149170 | A1 | 6/2008 | Hanoka |
| 2008/0187700 | A1 | 8/2008 | Smith et al. |
| 2008/0318478 | A1 | 12/2008 | Nelson et al. |
| 2010/0154327 | A1 | 6/2010 | Reyal et al. |
| 2010/0275976 | A1 | 11/2010 | Rubin et al. |
| 2011/0017278 | A1* | 1/2011 | Kalkanoglu ............ H02S 20/25 52/173.3 |
| 2011/0100436 | A1 | 5/2011 | Cleereman et al. |
| 2011/0144816 | A1 | 6/2011 | Morjaria et al. |
| 2011/0168230 | A1 | 7/2011 | Buller et al. |
| 2011/0192448 | A1 | 8/2011 | Croft et al. |
| 2011/0220180 | A1 | 9/2011 | Cinnamon et al. |
| 2012/0006483 | A1 | 1/2012 | Hanoka et al. |
| 2012/0013191 | A1 | 1/2012 | Jeanbeaud |
| 2012/0073623 | A1 | 3/2012 | Jones et al. |
| 2012/0085040 | A1 | 4/2012 | Ketwitz, Jr. |
| 2012/0181973 | A1 | 7/2012 | Lyden |
| 2012/0197452 | A1 | 8/2012 | Matthews et al. |
| 2013/0068289 | A1 | 3/2013 | Tseng et al. |
| 2013/0130534 | A1 | 5/2013 | Ohkuma |
| 2013/0212410 | A1 | 8/2013 | Li et al. |
| 2013/0252472 | A1 | 9/2013 | Watanabe et al. |
| 2014/0229030 | A1 | 8/2014 | Hardin |
| 2014/0345690 | A1* | 11/2014 | Taira ................... H01L 31/0516 136/259 |
| 2015/0129015 | A1 | 5/2015 | Maeda |
| 2015/0311371 | A1 | 10/2015 | Krishnamoorthy |
| 2016/0079696 | A1 | 3/2016 | Krishnamoorthy |
| 2018/0054070 | A1 | 2/2018 | Krishnamoorthy et al. |
| 2018/0054160 | A1 | 2/2018 | Krishnamoorthy |

FOREIGN PATENT DOCUMENTS

| | | | |
|---|---|---|---|
| JP | 2003317830 A | 11/2003 | |
| JP | 2007019140 A | 1/2007 | |
| KR | 20000033782 A | 6/2000 | |
| KR | 20080061779 A | 7/2008 | |
| KR | 101299004 B1 * | 8/2013 | ............ H01L 31/042 |
| WO | 2014076446 A1 | 5/2014 | |

OTHER PUBLICATIONS

English machine translation of Jeong et al. (KR 10 1299004) published Aug. 23, 2013.*
SVARC, "What is a Hybrid Solar System?" Clean Energy Reviews, pp. 1-6, date accessed Aug. 11, 2016.
Nayar et al., "A Solar/Mains/Diesel Hybrid Uninterrupted Power System—A Project Implemented in India," Centre for Renewable Energy Systems Technology Australia (CRESTA), pp. 1-7, 1997.
Khare et al., "Solar-Wind Hybrid Renewable Energy System: A Review," Renewable and Sustainable Energy Reviews, 58: 23-33, 2016.

* cited by examiner

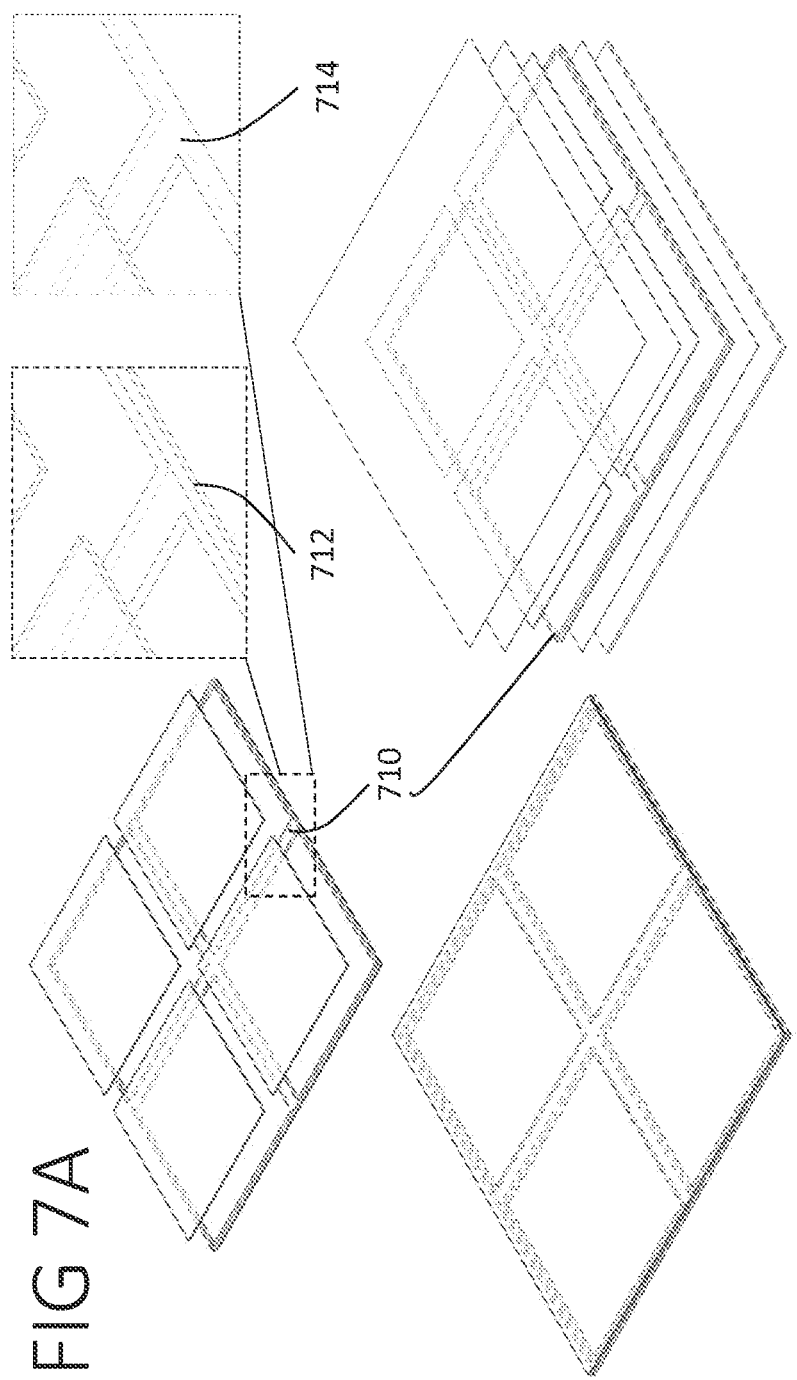

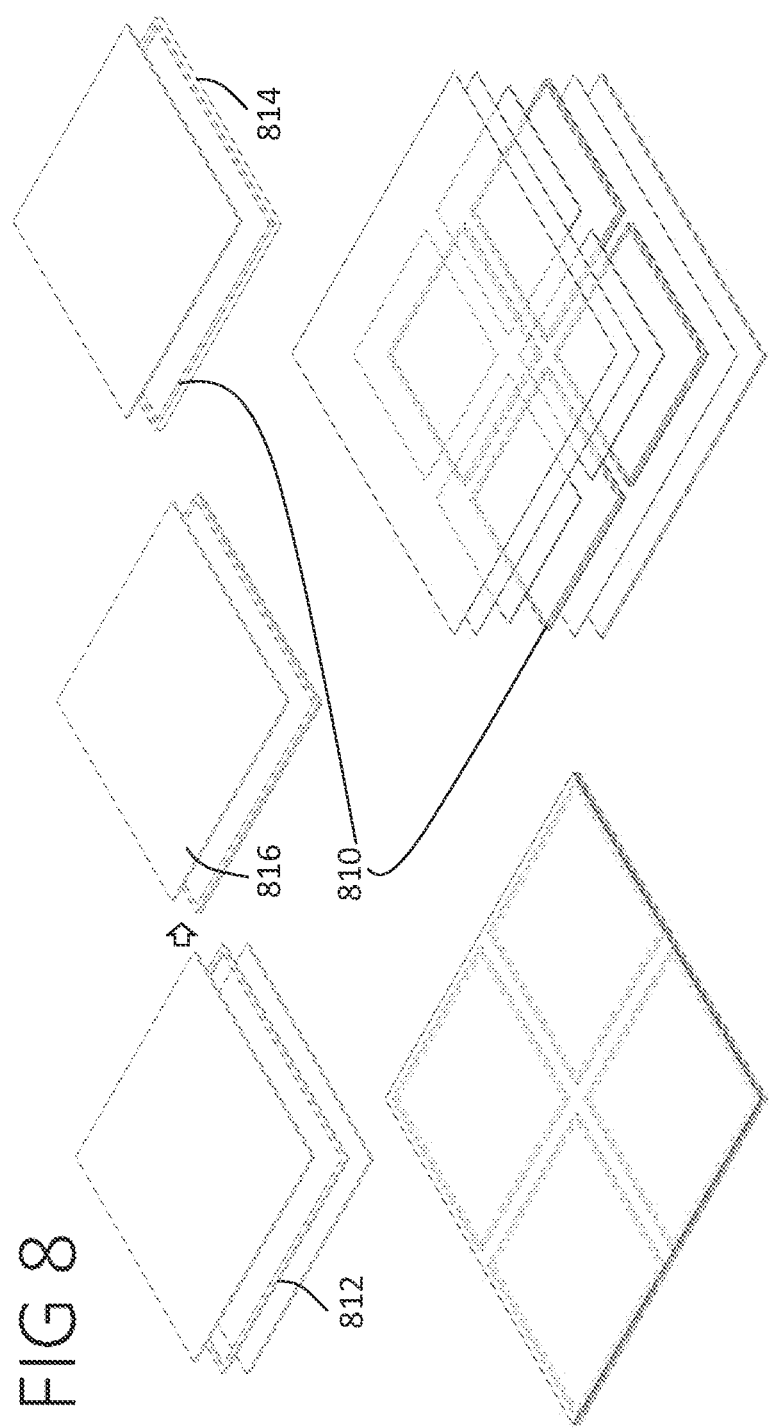

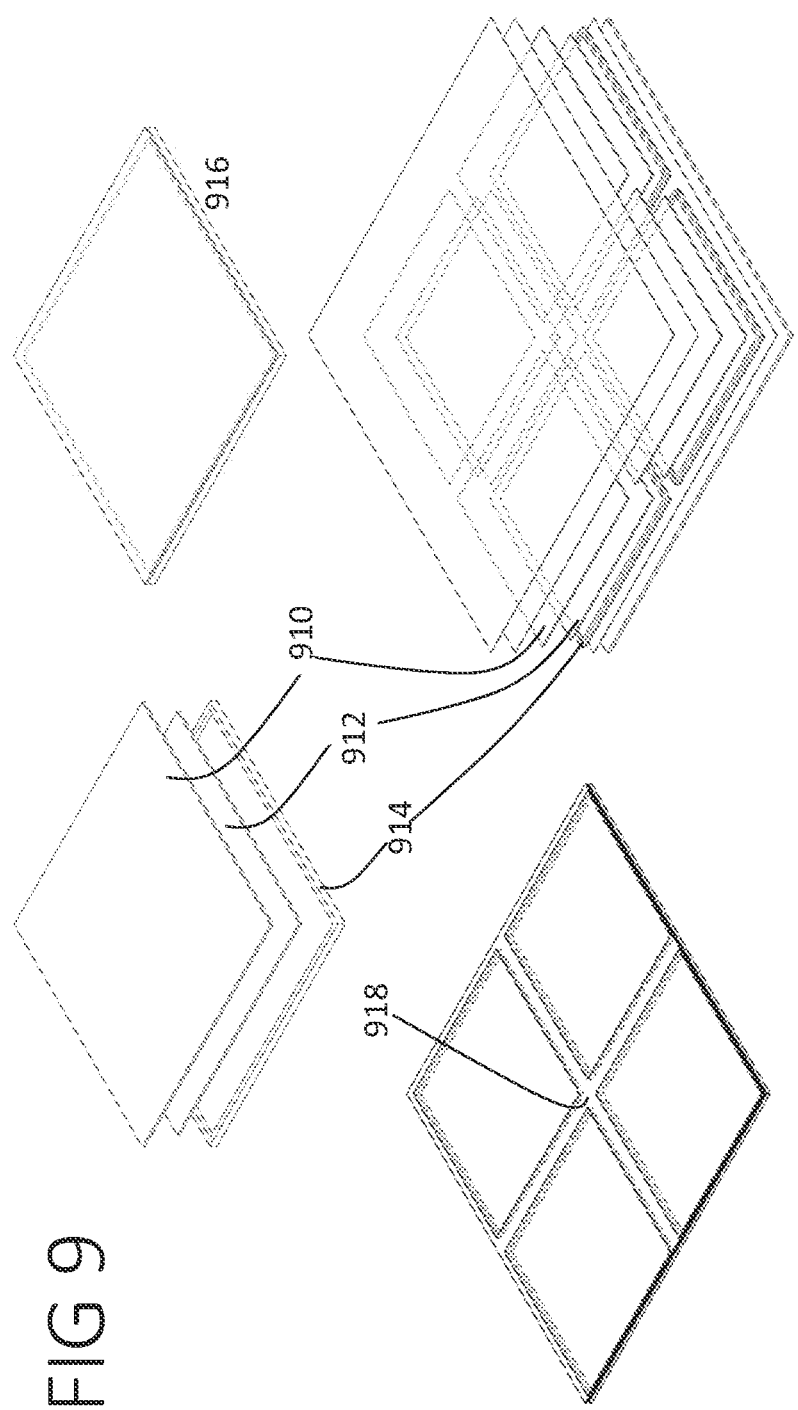

LIGHTWEIGHT SOLAR PANELS WITH SOLAR CELL STRUCTURAL PROTECTION

CROSS REFERENCE TO RELATED APPLICATIONS

The present application is a continuation of U.S. patent application Ser. No. 15/959,953, filed on Apr. 23, 2018 and titled LIGHTWEIGHT SOLAR PANELS WITH SOLAR CELL STRUCTURAL PROTECTION, which claims the benefit of and priority to U.S. Provisional Patent Application Ser. No. 62/489,232, filed Apr. 24, 2017, and titled LIGHTWEIGHT SOLAR PANELS WITH SOLAR CELL STRUCTURAL PROTECTION, the disclosures of which are incorporated herein by reference.

TECHNICAL FIELD AND INDUSTRIAL APPLICABILITY

The present invention relates to the technical field of solar energy conversion devices. More particularly, this invention relates to a method of construction of light weight, flexible solar photovoltaic modules.

BACKGROUND

Most common high efficiency solar cells that are commercially available are made of crystalline Silicon and they are brittle. As illustrated in FIG. 1, such solar cells [118] are enclosed within transparent Ethylene Vinyl Acetate (EVA) material [116] and protected by thick low-iron glass [114] and an Aluminum frame [112] in a typical glass solar panel [110]. The glass [114] protects the solar cells [118] from damage due to impact from the environment like hail, stones or foot traffic. It also protects from damage due to torsional stress, for example, due to twisting or bending forces. But the glass panels are bulky, heavy and expensive to install.

To avoid the excess weight and make installation easier, the trend is towards the development of glass-free, light-weight, and flexible solutions. As shown in FIG. 2, example solar panels [210] may use a fluoropolymer film [212] instead of glass as the top cover and use multiple EVA layers [214] as encapsulants on a suitable substrate like fiberglass. However, the lack of a thick solid top cover, like glass, makes solar cells [216] inside these light-weight solar panels more susceptible to impact damage and stresses from torsional and bending forces. The current understanding is that the EVA layer that melts into the gaps surrounding the solar cells is enough to protect the cells from impact and other damages. But field usage has proven that it is not enough and the cells do develop microcracks when laminated into such light-weight flexible solar panels. A lightweight panel as shown in FIG. 2 is prone to damage in typical use. It has been noted that even with rooftop installations, people still walk on the panels during, for example, roof and gutter maintenance.

New and alternative solutions are desired. The present invention proposes addition of mechanical and structural reinforcements to the solar cells in light-weight, flexible solar panels to protect the fragile solar cells from damage.

SUMMARY OF INVENTION

The present invention proposes novel mechanical support structures for light-weight, flexible solar panels, to prevent inadvertent stress on the Silicon solar photovoltaic cells inside solar panels. In some examples, a solar panel comprising cells includes a plurality of modular supports, such as one modular support for each cell, with gaps between the cell supports to allow the panel to flex when strained while protecting the individual cells. In other examples, a solar panel comprises a plurality of solar photovoltaic cells and a support or plural supports designed to accept force applied to the top of the panel and divert such force around the individual cells, without the use of a heavy glass support over top. For example, depressions can be defined to receive individual cells with a spine or ridge between each cell to accept the pressure of foot traffic, for example. Some examples may include both individual supports for each cell as well as ridges or spines to direct applied forces around the individual cells.

A first illustrative and non-limiting example takes the form of a solar panel comprising: a plurality of solar cells electrically connected together with a plurality of electrical connectors; one or more layers of encapsulant; and a plurality of individual protective supports sized and shaped for each of the plurality of solar cells such that for each of the solar cells there is a corresponding one of the protective supports aligned therewith.

Additionally or alternatively to the first illustrative, non-limiting example, the solar panel may have a front side for exposure to the sun and a back side, wherein the plurality of individual protective supports are each placed between a respective solar cell and the front side of the solar panel.

Additionally or alternatively to the first illustrative, non-limiting example, the front side may comprise a fluoropolymer film layer at as an outermost layer on the front size of the solar panel.

Additionally or alternatively to the first illustrative, non-limiting example, the plurality of individual protective supports may comprise a material that is substantially transparent relative to wavelengths of light to be absorbed by the solar cells.

Additionally or alternatively to the first illustrative, non-limiting example, the plurality of individual protective supports may be glass.

Additionally or alternatively to the first illustrative, non-limiting example, the solar panel may have a front side for exposure to the sun and a back side, and the plurality of individual supports may be each placed between a respective solar cell and the back side of the solar panel.

Additionally or alternatively to the first illustrative, non-limiting example, the plurality of individual supports may be formed of a light weight plastic or polymer, which may in some examples be carbon fiber.

Additionally or alternatively to the first illustrative, non-limiting example, in some examples, the solar panel does not comprise any glass.

Additionally or alternatively to the first illustrative, non-limiting example, the panel may further comprise a substrate layer disposed outside of the encapsulant, with the encapsulant adhering to the substrate layer.

Additionally or alternatively, the solar cells and the protective supports may be spaced from one another to define gaps therebetween, and the substrate may be flexible, such that the solar panel can be folded without damage at the gaps.

Additionally or alternatively, the individual supports may maintain the solar cells in a flat position individually if the solar panel is folded at one or more of the gaps.

Additionally or alternatively, the encapsulant may surround the solar cells and the protective supports.

Additionally or alternatively, at least one protective support comprises a ridge adapted to surround a corresponding solar cell, the ridge having a thickness greater than that of the solar cell, such that a force applied to the front of the solar panel is absorbed by the ridge.

Additionally or alternatively, the plurality of solar cells may comprise at least 4 solar cells.

Additionally or alternatively to the first illustrative, non-limiting example, at least one protective support may comprise a ridge adapted to surround a corresponding solar cell, the ridge having a thickness greater than that of the solar cell, such that a force applied to the front of the solar panel is absorbed by the ridge.

A second, illustrative, non-limiting example takes the form of a solar panel having a front side for receiving sunlight and a back side, the solar panel comprising: a plurality of solar cells electrically connected together with a plurality of electrical connectors, the plurality of solar cells having a front side and a back side; one or more layers of encapsulant; and at least one protective support for at least one of the solar cells, the protective support comprising a ridge member to define a ridge relative to the front side of the panel and the at least one solar cell, wherein the ridge extends beyond the front side of the at least one solar cell, such that a force applied to the front of the solar panel is diverted away from the at least one solar cell.

Additionally or alternatively to the second illustrative, non-limiting example, the panel may comprise a plurality of protective supports each corresponding to one of the solar cells.

Additionally or alternatively to the second illustrative, non-limiting example, the solar panel may further comprise a plurality of front protectors each corresponding to one of the solar cells, the front protectors sized to correspond to the ridges such that an impact or force received by a front protector will be translated to a ridge, and not to a corresponding solar cell.

Additionally or alternatively to the second illustrative, non-limiting example, at least one of the protective supports may be configured to provide ridges around a perimeter of each of at least two of the solar cells.

A third illustrative, non-limiting example takes the form of a solar panel having a front side and a back side, the panel comprising: a front layer of a fluoropolymer; an encapsulant layer behind the fluoropolymer; a plurality of solar cells behind the encapsulant layer; for each of the plurality of solar cells, an individual support member behind the solar cell; an encapsulant layer behind the individual support members; and a substrate at the back side of the solar panel.

Additionally or alternatively to the third illustrative, non-limiting example, the solar cells and support members may have gaps there-between, and the solar panel is capable of flexing at the gaps.

Additionally or alternatively to the third illustrative, non-limiting example, the solar cells and support members may have gaps there-between, and the solar panel may be capable of folding at the gaps.

A fourth illustrative, non-limiting example takes the form of a solar panel having a front side and a back side, the panel comprising: a front layer of a fluoropolymer; an encapsulant layer behind the fluoropolymer; a plurality of solar cells behind the encapsulant layer; for each of the plurality of solar cells, an individual support member in front of the solar cell at a position with encapsulant at least one of in front of, behind, or both in front of and behind, the individual support member; an encapsulant layer behind the solar cells and a substrate at the back side of the solar panel.

Additionally or alternatively to the fourth illustrative, non-limiting example, the solar cells and support members may have gaps therebetween, and the solar panel may be capable of flexing at the gaps.

Additionally or alternatively to the fourth illustrative, non-limiting example the solar cells and support members may have gaps therebetween, and the solar panel may be capable of folding at the gaps.

A fifth illustrative non-limiting example takes the form of a solar panel having a front side and a back side, the panel comprising: a front layer of a fluoropolymer; an encapsulant layer behind the fluoropolymer; a plurality of solar cells behind the encapsulant layer; for at least one of the plurality of solar cells, a support structure comprising a plurality of ridges surrounding and corresponding to the at least one solar cell, the ridges extending beyond a front side of the at least one solar cell; an encapsulant layer behind the solar cells; and a substrate at the back side of the solar panel.

Additionally or alternatively to the fifth illustrative, non-limiting example, the panel may further comprise at least one additional support structure, each support structure having a same design, such that for each solar cell, the solar panel includes a support structure.

Additionally or alternatively to the fifth illustrative, non-limiting example, the support structure may comprise a set of ridges arranged to surround a periphery of each of the solar cells.

Additionally or alternatively to the fifth illustrative, non-limiting example, the panel may further comprise a front protector placed between the ridges and the fluoropolymer layer and adapted to translate a force applied to the front of the solar panel to the ridge and away from the solar cells.

BRIEF DESCRIPTION OF DRAWINGS

FIGS. 7A-7B show the addition of mechanical ridge support structures to a monolithic rigid base plate, that surrounds the solar cells;

FIG. 8 shows the addition of mechanical ridge support structures to a modular rigid base plate, that surrounds individual solar cells in a light-weight solar panel;

FIG. 9 shows the addition of mechanical ridge support structures and a transparent rigid top plate to a modular rigid base plate, that surrounds individual solar cells in a light-weight solar panel;

DETAILED SPECIFICATIONS

The following detailed description should be read with reference to the drawings. The drawings, which are not necessarily to scale, depict illustrative embodiments and are not intended to limit the scope of the invention.

Figure 1:
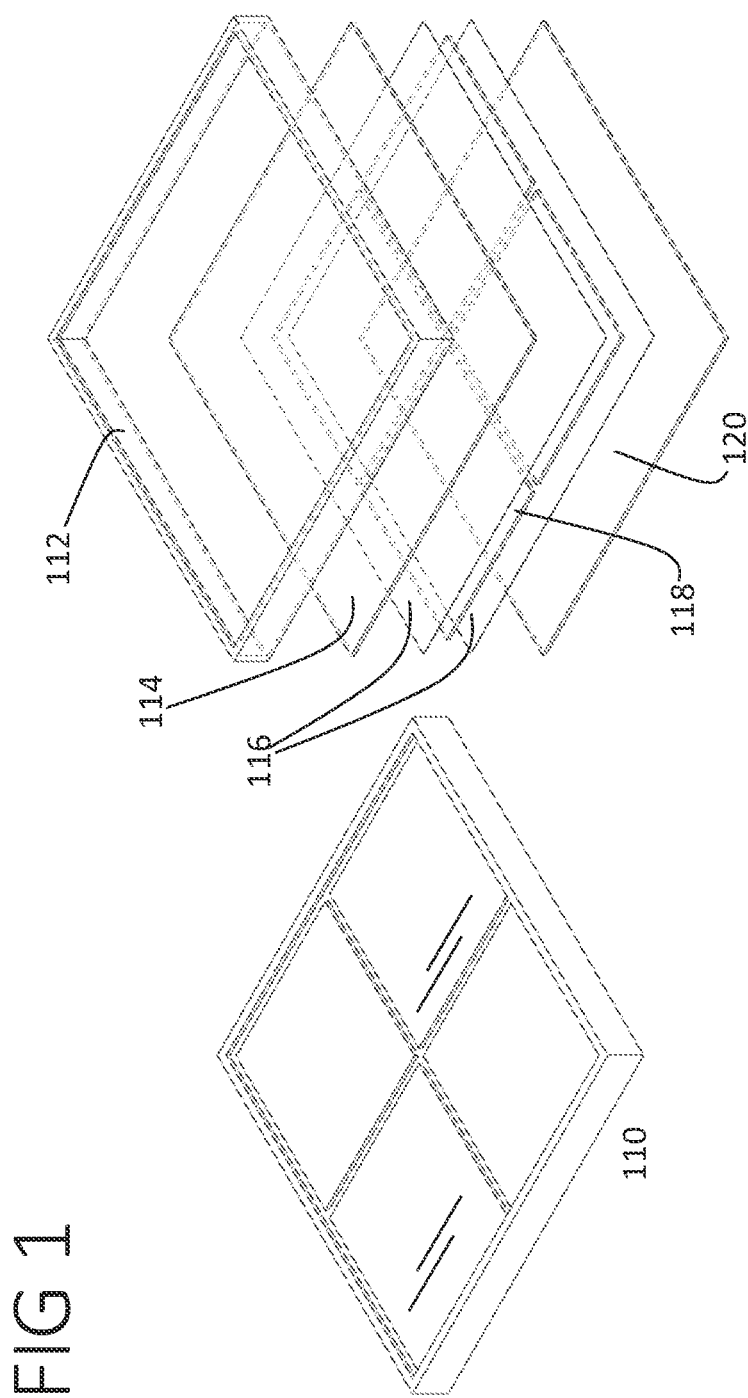
FIG. 1 shows the various layers of a standard glass solar photovoltaic panel with an Aluminum frame.

As seen in FIG. 1, the thick top glass [114] in the standard glass panels [110] and the Aluminum frame [112] protect the solar cells from impact damage and torsional and bending stresses. The frame [112] holds up the top glass [114] providing in combination a protected well for the more fragile solar cells [118].

The encapsulant [116], typically Ethylene-Vinyl Acetate (EVA), that covers the gaps surrounding the solar cells [118] acts as a buffer layer between the glass, embedded solar cells and a stiff substrate [120]. The solar cells inside the solar panels are protected mainly by the glass on top of the solar panel. But this glass also makes the panels heavy due to weight of glass and the Aluminum frame, and this weight has led to introduction of light-weight solar panel which replaces the heavy top glass with a fluoropolymer film.

Figure 2:
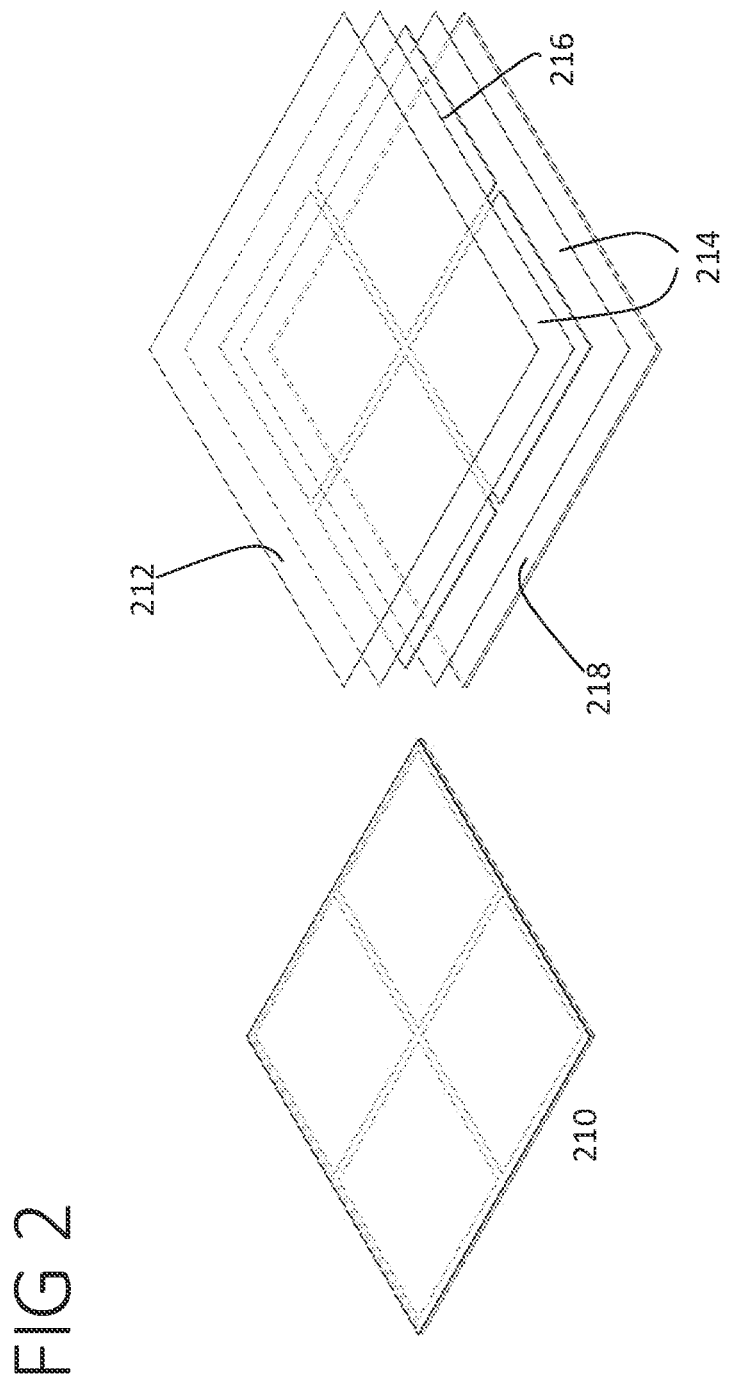
FIG. 2 shows the various layers of a typical light-weight flexible solar panel.

The light-weight glass free solar panel [210], as can be seen in FIG. 2, comprises similar EVA encapsulant [214] surrounding the solar cells [216], placed in between a substrate [218] and a transparent Fluropolymer film [212]. The transparent Fluoropolymer film which is used as a replacement for glass due to its optical characteristics, does not offer the same kind of mechanical protection to the underlying solar cells as a thick glass sheet. The stiffness of substrate [218] provides some basic mechanical support in the current state-of-the-art light-weight solar panels, but is usually not enough to prevent damage to the solar cells embedded in the panels. Thus for example, bending and twisting forces during installation can be protected against by the substrate [218], however, the structure does little to protect against pressure from foot traffic, which must be absorbed across the substrate [218] and can cause bending of the individual cells [216] leading to damage.

In illustrative examples, the present invention offers various mechanical support structures that can offer additional protection to the solar cells in light-weight solar panels.

Figure 3:
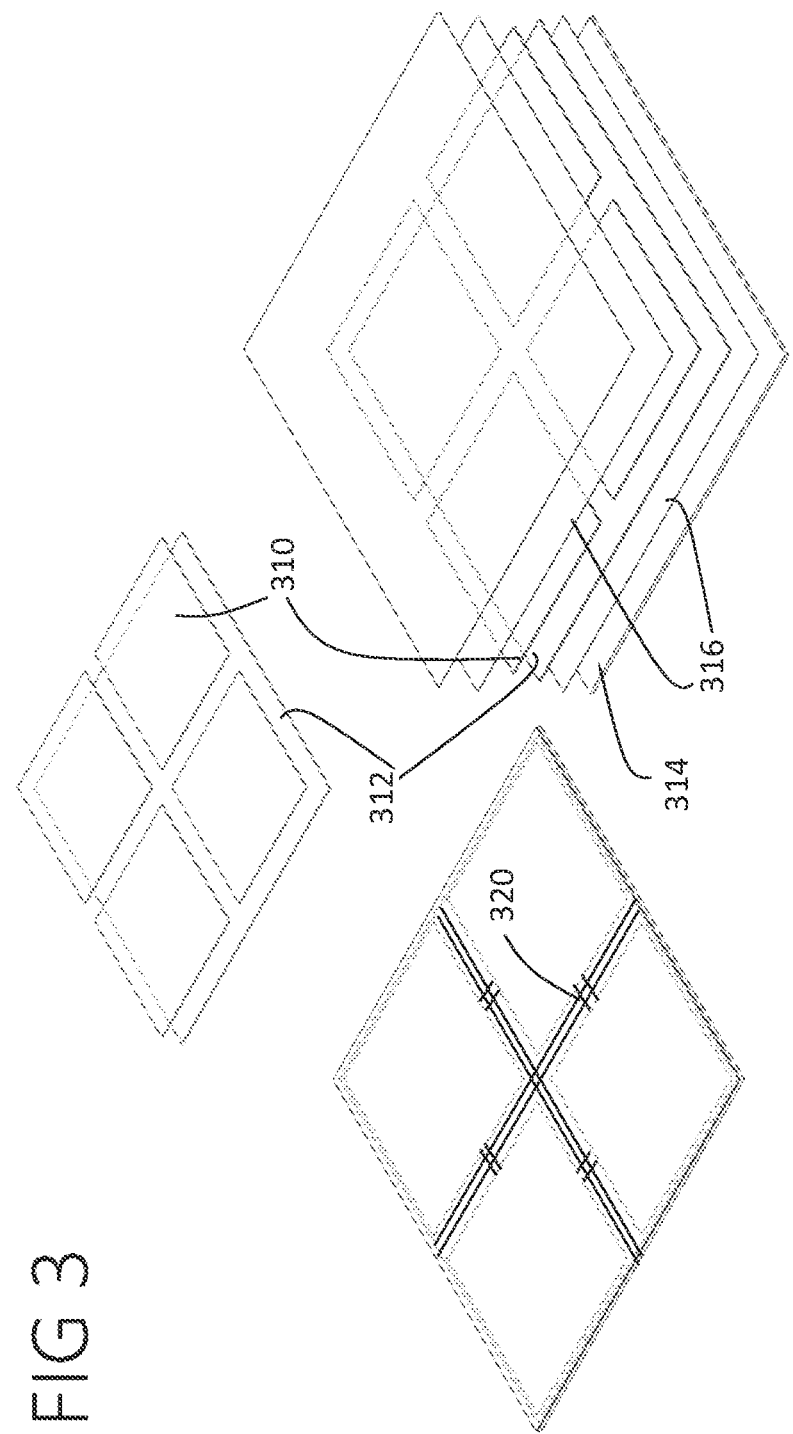
FIG. 3 shows the addition of a monolithic rigid baseplate for protection of a group of solar cells in a light-weight solar panel.

FIG. 3 shows a simple solution to better protect the solar cells [310] inside a light-weight solar panel by adding a stiff monolithic base plate [312], that supports the entire collection of solar cells in the solar panel. This base plate [312] is placed in between the flexible substrate [314] and the solar cells [310] and can itself serve as the substrate in many cases for the manufacturing of the solar panel. As can be seen, the base plate is in this example provided within the encapsulant layers [316]. This base plate [312] can be made of various stiff material like metals, ceramic, and fiberglass, or lighter material like carbon fiber and various kinds of plastics and can be engineered to make the resulting solar panel lighter than a typical glass panel. A monolithic stiff base plate can offer protection against torsional and bending stress, but it also makes the solar panel inflexible.

For illustrative purposes, FIG. 3 also shows a plurality of interconnects within the solar panel structure. The interconnects [320] electrically couple the individual cells of the panel together and provide electrical connection at the edges of the solar panel for allowing electrical power generated by the individual cells [310] to be obtained from the panel assembly. The innerconnects may form part of an interconnect layer which is omitted in the remaining drawings for clarity purposes. It is to be understood that such interconnects are included in each of the embodiments herein even if not explicitly shown. The use and design of interconnects in the present invention may use widely known approaches in the art, or alternatively, may in some embodiments take the forms shown in US PG Pat. Pub. No. 20150311371, titled METHOD FOR QUICK SELF INTERCONNECTION OF PHOTOVOLTAIC CELL ARRAYS AND PANELS, the disclosure of which is incorporated herein by reference.

The solar cells [310] may be of common design well known in the art, such as using conventional silicon crystalline photovoltaic solar cells.

Figure 4:
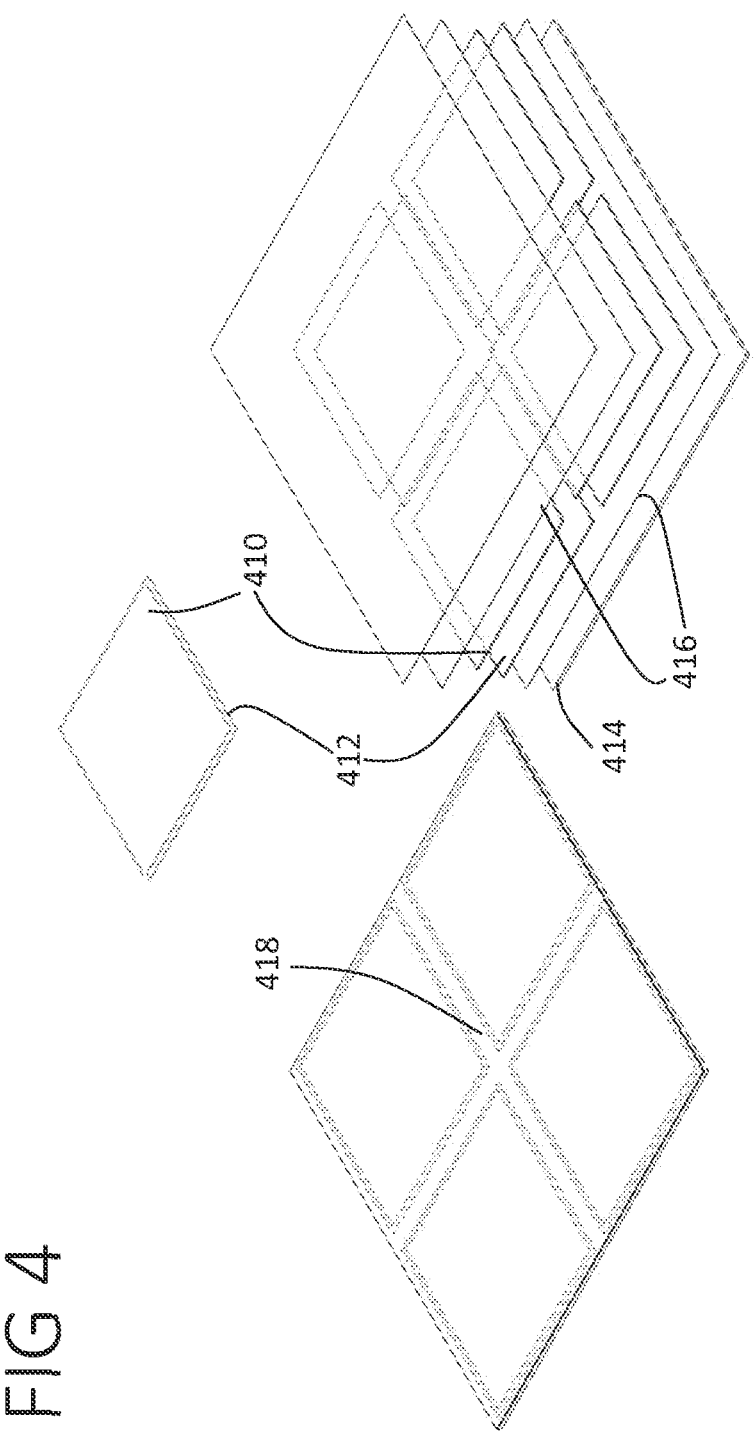
FIG. 4 shows the addition of a modular rigid base plate for the protection of individual solar cells in a light-weight solar panel.

An enhancement on the example of FIG. 3 is shown in FIG. 4. Addition of modular or distributed stiff base plates [412] that mechanically support individual solar cells, as shown in FIG. 4, offers similar protection to solar cells [410] as a monolithic stiff base plate described relative to FIG. 3 but a modular stiff base plate [412] can help in making the entire solar panel more flexible and in many instances even foldable. For example, a panel may be described as flexible if it can bend to an angle of at least at least 5 degrees from flat at one of the gaps, or may be described as foldable if it can bend to an angle of at least 30 degrees at one of the gaps. In some examples, the panel may be folded completely over on itself.

The modular stiff base plate [412] may be equal or greater in size than the dimensions of the individual solar cells in a solar panel, so as to provide adequate mechanical support. The modular base plates [412] may again be made of various stiff material like metals, ceramic, and fiberglass, or lighter material like carbon fiber and various kinds of plastics and can be engineered to make the resulting solar panel lighter than a typical glass panel. The modular base plates [412] are shown in this example again as being contained within the encapsulant layers [416].

In the completed assembly, the individual cells [410] are protected by corresponding modular base plates [412], while gaps [418] are defined in the panel between these protected areas. Foot traffic or other weight/pressure on the panel can be absorbed by allowing the gaps [418] to be flexible, while the modular base plates [412] de-strain the individual cells [410].

The stiff base plate is meant to offer the solar cells protection against torsional and bending stress. In an alternative construction shown in FIG. 5, the stiff plate [512] may instead be placed atop the individual solar cells [510] rather than behind them. For example, thin transparent glass or optically passing hard plastic top plate [512] can be placed on top of the individual solar cells [510] in a solar panel. As before, the plate [512] may be within the encapsulant layers (not marked).

The added advantage of placing a thin glass panel on a solar cell is that it can even offer basic protection against impact from objects dropped on the solar panels. Thus, force applied by foot traffic can be absorbed in the gaps [514], and impact from, for example, a baseball or hail striking the panel can be protected against with a thin rigid top piece [512]. The disadvantage of placing a stiff material on top of the solar cells is that it has to be transparent, which limits the material choices, whereas a stiff baseplate that supports solar cells from underneath can have more choices of material like metals, ceramics, carbon fiber and some plastics.

Figure 5:
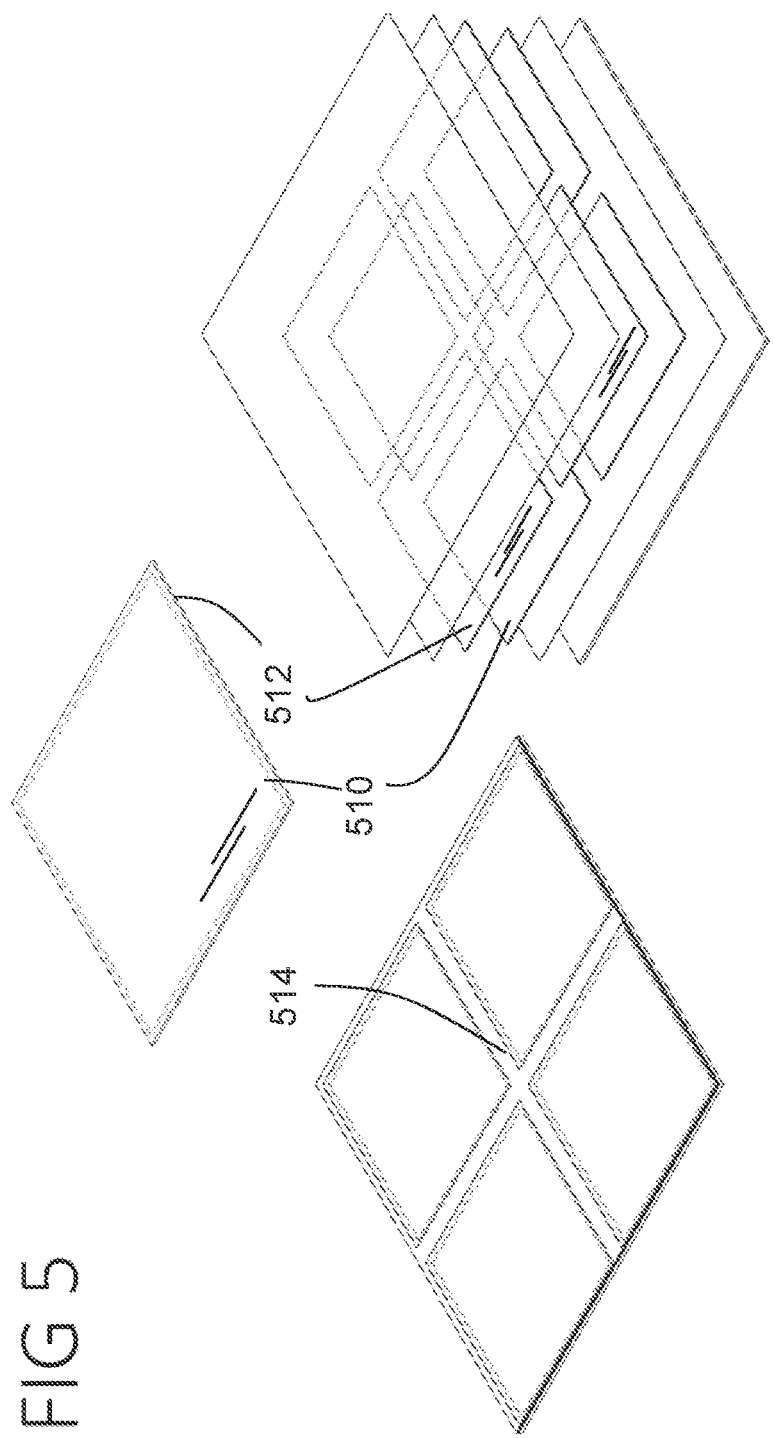
FIG. 5 shows the addition of a transparent rigid plate on top of individual solar cells in a light-weight flexible solar panel.

In some examples, both a modular top piece [512, FIG. 5] and a modular baseplate [412, FIG. 4] may sandwich each individual cell. The entire sandwich of a cell with modular top and bottom pieces may be contained in the encapsulant.

Figure 6:
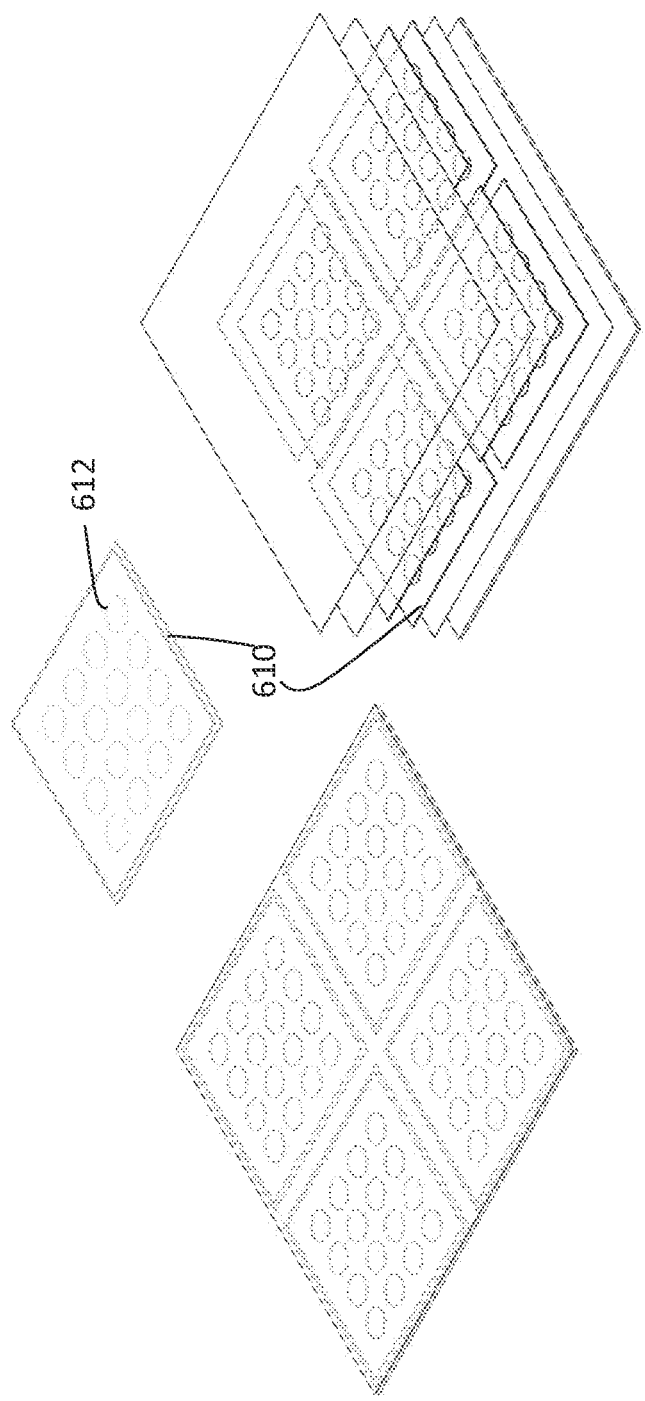
FIG. 6 shows a variation in the design of the modular rigid base plate shown in FIG. 4 which can potentially make the base plate and the resultant solar panel lighter.

FIG. 6 shows another embodiment. In this example, the modular stiff base plate [610] has patterned cutouts. The patterns are not limited to circular shapes [612] as seen in FIG. 6. Carefully designed patterned cutouts can help reduce the weight of the solar panels without compromising the rigidity and stiffness of the support for the individual solar cells.

With a modular stiff baseplate underneath the solar cells or a modular stiff transparent top plate on top of individual solar cells, the stiffness of the substrate can now be substantially reduced to the point where the areas [418] [514] in between solar cells and the supporting stiff plates can become flexible without the risk of damage to the solar cells. If the spacing between the solar cells in a solar panel is sufficient, the flexible solar panels can even be folded.

Figure 7B:
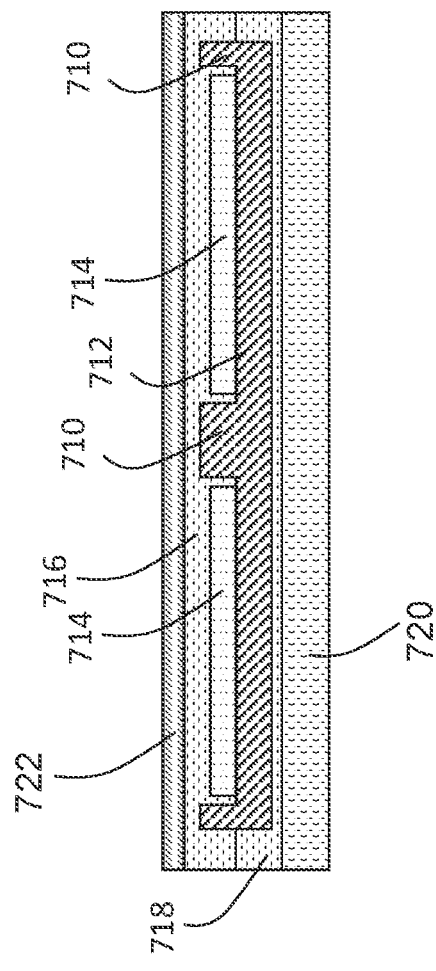

To add protection to solar cells from impact stress, FIG. 7A-7B proposes addition of mechanical ridge support [710] on top of a monolithic stiff base plate [712], in areas between the solar cells [714]. As shown in the section view of FIG. 7B, the height of the mechanical ridge [710] may be greater than the thickness of the solar cells [714] to minimize the impact of any object that could fall on the solar panel and/or to absorb pressure for example from foot traffic. The mechanical ridges [710] can be added as an additional layer that is placed on top of the stiff base plate or can be formed directly on the stiff base plate as a monolithic shape using appropriate die pressing or milling techniques. As shown in the section view of FIG. 7B, the top of the mechanical ridge may be flat.

As shown in the section view of FIG. 7B, encapsulant layers [716, 718] can surround the mechanical support 710, 712 and individual solar cells [714] to form a panel with a substrate 720 and transparent top layer 722. The top layer [722] may be, for example, a fluoropolymer layer, and as in all the examples herein, the encapsulant may be any suitable material having flowable and adhesive characteristics such as EVA.

While FIGS. 7A-7B show a single base plate receiving a plurality of individual solar cells, a modular approach may also be used. As shown in FIG. 8, the mechanical ridge support structures [810] can also be added to modular stiff base plates [814]. The mechanical ridge support structures [810] can be either added as an external layer [812] attached to the base plate [814], or the base plate [814] may be formed with the ridge support [810] using die pressing or milling techniques, for example. The hollow region defined by the mechanical ridge support structures [810] and stiff baseplate [814] can now house a solar cell [816] and protect it from torsional and bending stresses as well as limited impact damage from larger objects and/or foot traffic that will apply pressure on the ridges as opposed to the solar cells themselves. Similar to what is shown in FIG. 7B, the encapsulant layer (such as the adhesive EVA) fills the gaps between and atop the solar cells and a fluoropolymer top layer help in transferring some of the impact stress to the mechanical support ridges, thus relatively protecting the solar cells themselves from the full force of an impact and/or foot traffic.

The effectiveness of the mechanical ridge support is a factor of the size and shape of the impacting object. Mechanical ridge support tends to protect the solar panels better from impacting objects with a larger contact area. For example, a solar panel with mechanical ridge support is more protected from foot traffic and impact from a rectangular brick than from a golf ball or a small stone. The effectiveness of the mechanical ridges also improves with the reduction in the size of the solar cells within a panel. The increase in ratio of the surface area occupied by the mechanical ridges relative to the area occupied by the solar cell improves the probability of the ridges absorbing an impact from a falling object.

FIG. 9 shows yet another embodiment of mechanical structures with a layer of modular glass sheet [910], similar to that of FIG. 5, above, added on top of the mechanical ridge supports [914] as in FIGS. 7A-7B and 8. This box like enclosure [916] protects an enclosed solar cell [912] from torsional and bending stresses as well as from impact of falling objects and offers the greatest amount of protection for the light-weight solar panel. Such a modular assembly enclosing individual solar cells allows for proper spacing of the said assembly within a panel, to allow areas of high flexibility [918] between individual cells.

Figure 10:
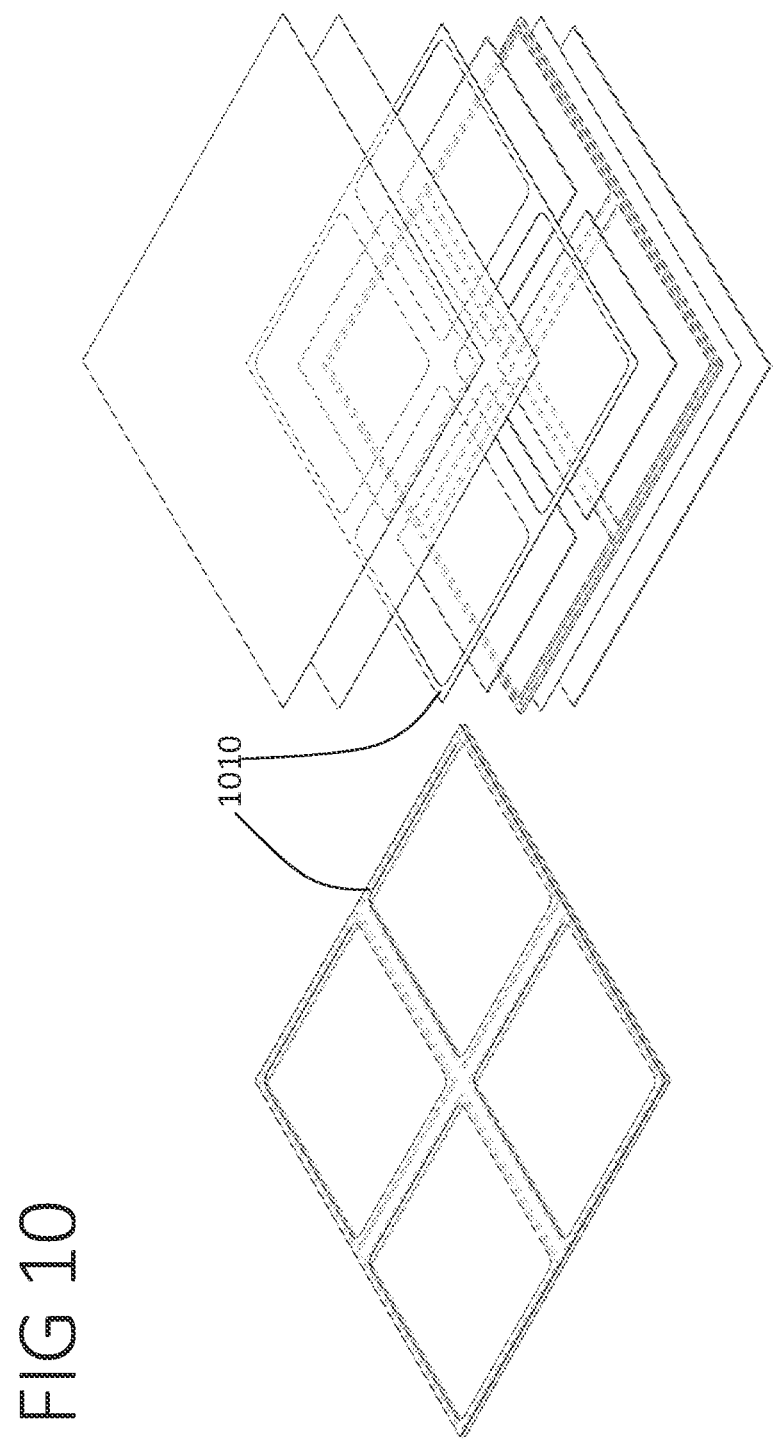
FIG. 10 shows the addition of a cosmetic layer on top solar cells, that covers the mechanical ridge support structures in a light-weight flexible solar panel.

FIG. 10 shows the possibility of adding a cosmetic layer [1010] on top of the mechanical ridge structures to hide the ridge in the finished panel.

Figure 11:
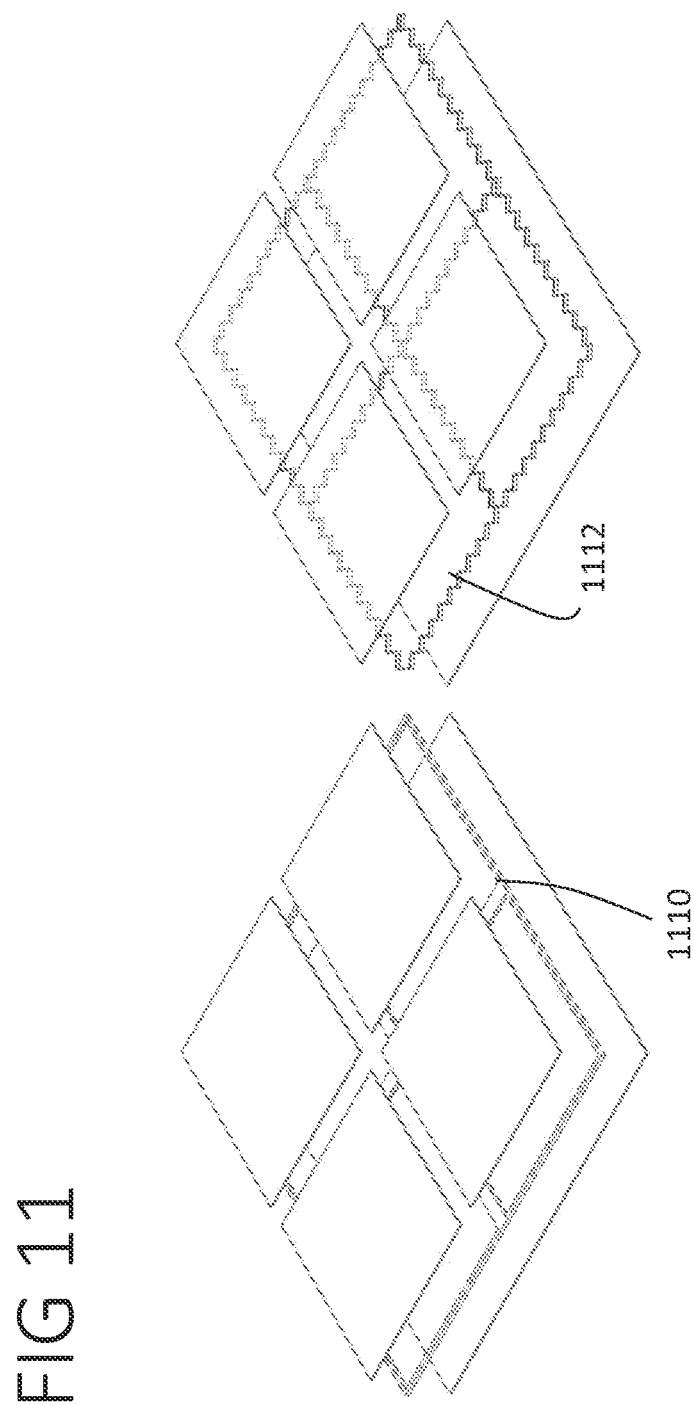
FIG. 11 shows possible variations in shape of the monolithic rigid support structure in a light-weight flexible solar panel.

In yet another embodiment of the mechanical ridge support structure shown in FIG. 11 shows two possible but non-limiting types of the mechanical ridge support. The ridges can have a wave like [1110] or zigzag shape [1112] instead of a rectilinear shape. Such shapes when may also provide adequate protection while reducing the amount of material used and correspondingly the weight of the solar panel.

Figure 12:
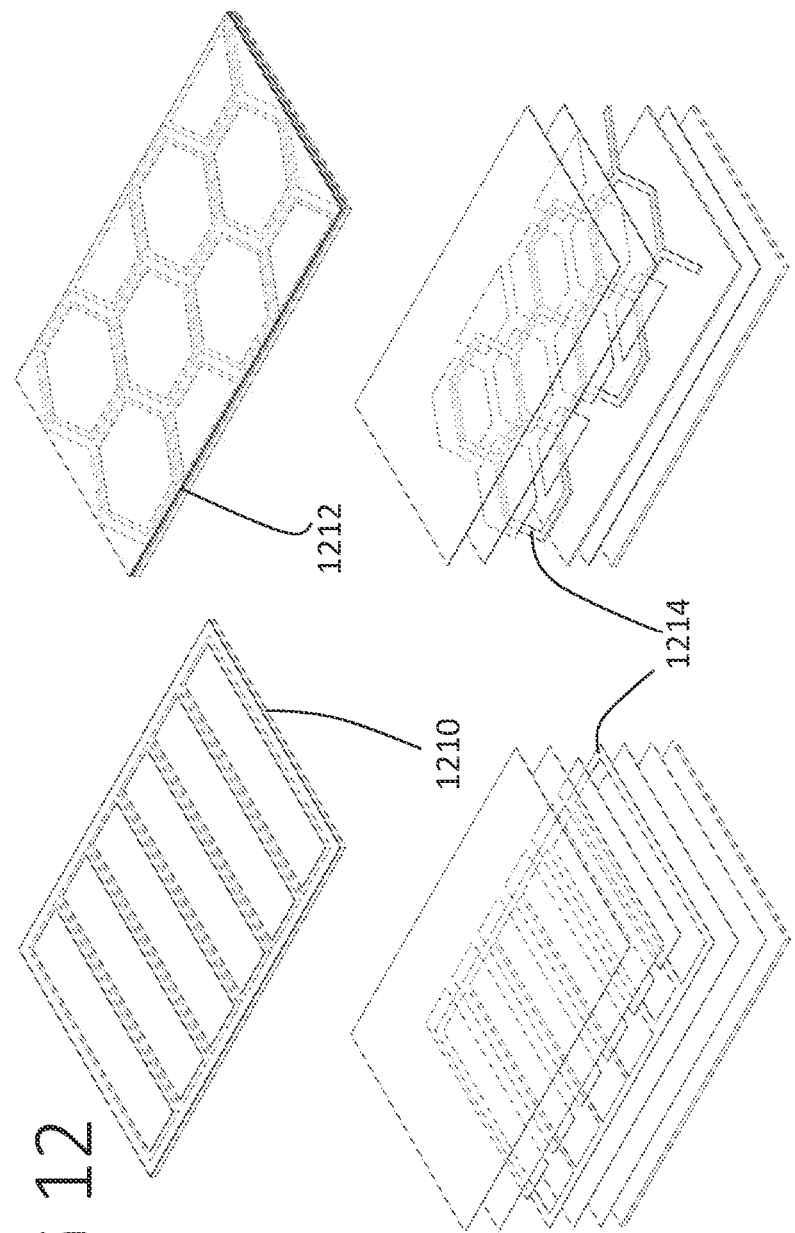
FIG. 12 shows possible variations in the shapes of solar cells and corresponding variation in the mechanical support structures that can be accommodated.
Figure 13:
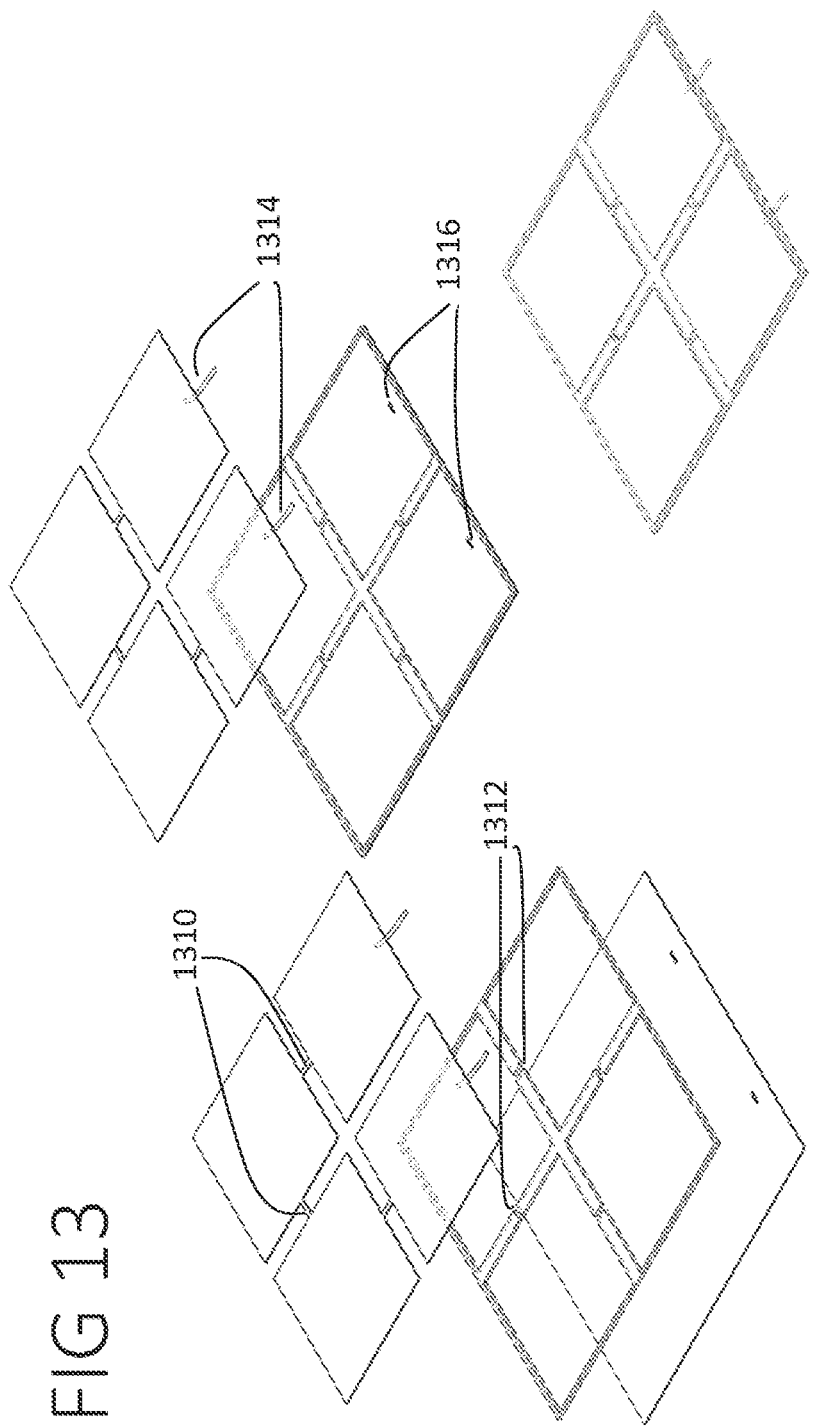
FIG. 13 shows the structural modification to the rigid baseplate and the mechanical ridge support structures to accommodate thick conductive wires connecting solar cells with each other and solar cells to external loads.

In yet another embodiment of the light-weight solar panels with built in mechanical support structure, FIG. 12 shows the potential of accommodating solar cells of arbitrary shapes. FIG. 12 shows panels with rectangular [1210] and hexagonal [1212] shaped cells protected with appropriately shaped mechanical ridge support structure [1214] to illustrate that the panels or the cells therein are not just limited to square shapes.

The solar cells in a typical panel are connected to each other using ribbon like tabbing wire. These wires are thin enough to be placed underneath the mechanical ridge support structure during the encapsulation process. But there could be instances where the connecting wires are thick [1310] and create a bulge when placed underneath the ridges. In such cases the mechanical ridge support structures can be cut in appropriate locations [1312]. For wires [1314] connecting the solar cells to an external junction box or external loads, holes can be made in the stiff base plates as shown in [1316].

Those skilled in the art will recognize that the present invention may be manifested in a variety of forms other than the specific embodiments described and contemplated herein. Accordingly, departures in form and detail may be made without departing from the scope of the present invention.

What is claimed is:
1. A solar panel having a front side and a back side, the panel comprising:
   a flat front layer;
   an encapsulant beneath the front layer; and
   a plurality of solar cell subassemblies each including a single solar cell and an individual support member, the individual support member including a base plate and a ridge support member defining a region for receiving the single solar cell with the ridge support member surrounding the single solar cell on all sides of the single solar cell;

wherein the encapsulant surrounds the solar cell subassemblies with gaps between the solar cell subassemblies.

2. The solar panel of claim 1 further comprising a plurality of glass sheets in the encapsulant, each corresponding to and placed over to a single one of the solar cell subassemblies.

3. The solar panel of claim 1 wherein the front layer is a fluoropolymer film layer and defines an outermost layer on the front side of the solar panel.

4. The solar panel of claim 1 wherein the solar cell subassemblies are configured with the single solar cell between the base plate and the front layer.

5. The solar panel of claim 1 wherein the individual support members are made of a material chosen from the group consisting of metals, ceramic, and fiberglass.

6. The solar panel of claim 1 wherein the individual support members are made of carbon fiber.

7. The solar panel of claim 1 wherein the solar panel does not comprise any glass.

8. The solar panel of claim 1 wherein the gaps between the solar cell subassemblies enable flexing of the solar panel while the solar cell subassemblies protect the solar cells from bending.

9. The solar panel of claim 8, further comprising a substrate layer disposed outside of the encapsulant at the back side of the solar panel, with the encapsulant adhering to the substrate layer, wherein the substrate layer is flexible such that the solar panel can be folded without damage at the gaps.

10. The solar panel of claim 1, wherein the ridge support members each have a thickness greater than a thickness of a corresponding solar cell, such that a force applied to the front of the solar panel is absorbed by the ridge support member.

11. The solar panel of claim 1 wherein:
the front layer is a fluoropolymer film defining a front surface of the solar panel;
the encapsulant is Ethylene Vinyl Acetate (EVA);
the individual support members are made of a material stiffer than the materials of the front layer and the encapsulant to thereby protect the solar cells.

12. The solar panel of claim 11 further comprising a plurality of glass sheets in the encapsulant, each corresponding to and placed over to a single one of the solar cell subassemblies, to thereby protect the solar cells from impact.

* * * * *